(12) United States Patent
Iyengar et al.

(10) Patent No.: US 11,564,334 B2
(45) Date of Patent: Jan. 24, 2023

(54) INSTALLING A SERVER BOARD

(71) Applicant: Google LLC, Mountain View, CA (US)

(72) Inventors: Madhusudan Krishnan Iyengar, Foster City, CA (US); Avinash Panga, Woodinville, WA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/113,461

(22) Filed: Dec. 7, 2020

(65) Prior Publication Data
US 2021/0092872 A1    Mar. 25, 2021

Related U.S. Application Data

(63) Continuation of application No. 16/139,789, filed on Sep. 24, 2018, now Pat. No. 10,863,651.

(51) Int. Cl.
*H05K 5/00* (2006.01)
*H05K 7/20* (2006.01)
(Continued)

(52) U.S. Cl.
CPC ....... *H05K 7/20509* (2013.01); *H05K 5/0208* (2013.01); *H05K 7/1401* (2013.01); *H05K 7/1487* (2013.01); *H05K 7/1489* (2013.01)

(58) Field of Classification Search
CPC ............. H05K 7/20509; H05K 5/0208; H05K 7/1401; H05K 7/1487; H05K 7/1489; H05K 7/20836; H05K 7/20772; H05K 7/20781; H05K 7/20327; H05K 7/20727; H05K 7/20; H05K 7/203; H05K 7/20281; H05K 7/20272; H05K 7/20636; H05K 7/20672;
(Continued)

(56) References Cited

U.S. PATENT DOCUMENTS 6,629,855 B1 *  10/2003  North ................... H05K 7/1405
                                                                   439/325
7,215,556 B2  5/2007  Wrycraft
(Continued)

FOREIGN PATENT DOCUMENTS

EP          0767601           4/1997

OTHER PUBLICATIONS

PCT International Preliminary Report on Patentability in International Application No. PCT/US2019/046792, dated Apr. 1, 2021, 8 pages.
(Continued)

*Primary Examiner* — Mandeep S Buttar
(74) *Attorney, Agent, or Firm* — Fish & Richardson P.C.

(57) ABSTRACT

A server tray assembly includes a server tray support configured to receive a server board that includes a working fluid conduit fluidly coupled to a server board connector disposed on a back plane of the server board, a back wall of the server tray support includes a fluid connector configured to form an unbiased fluid connection with the server board connector; and a locking assembly secured to at least one of a server rack or the server tray support, the locking assembly disposed opposite the fluid connector is configured to engage a portion of the server board to bias the server board toward the fluid connector to fluidly seal the unbiased fluid connection between the server board connector and the fluid connector of the server tray support.

22 Claims, 7 Drawing Sheets

(51) Int. Cl.
*H05K 5/02* (2006.01)
*H05K 7/14* (2006.01)

(58) Field of Classification Search
CPC .. H05K 7/183; H05K 7/20254; H05K 7/1488; E05B 47/0012; E05B 63/0017; E05B 63/0056; E05B 63/244; H01L 2924/0002; H01L 23/427; H01L 23/473; G06F 1/20; G06F 2200/201; G06F 1/181; F28D 15/00
USPC ......... 361/679.53, 699, 679.46, 679.58, 689, 361/726, 727, 754; 165/104.33, 80.4; 292/161, 197, 224; 70/58, 109, 25
See application file for complete search history.

(56) References Cited

U.S. PATENT DOCUMENTS

| | | | |
|---|---|---|---|
| 7,381,074 B1* | 6/2008 | Bridges | G06F 1/185 |
| | | | 439/325 |
| 7,455,539 B2* | 11/2008 | Gunther | H05K 7/1414 |
| | | | 439/157 |
| 8,593,827 B1* | 11/2013 | Lewis | H05K 7/1411 |
| | | | 361/801 |
| 8,820,351 B1 | 9/2014 | Harrington et al. | |
| 9,696,235 B2* | 7/2017 | Alshinnawi | F24F 11/0001 |
| 9,943,014 B2* | 4/2018 | Lyon | F28F 9/02 |
| 2003/0039100 A1 | 2/2003 | Salinas | |
| 2004/0012921 A1* | 1/2004 | Hidaka | G11B 33/022 |
| 2007/0279858 A1 | 12/2007 | Grady et al. | |
| 2009/0260777 A1 | 10/2009 | Attlesey | |
| 2010/0246118 A1* | 9/2010 | Attlesey | H05K 7/20236 |
| | | | 165/104.31 |
| 2011/0297628 A1* | 12/2011 | Gong | H05K 7/1489 |
| | | | 211/26 |
| 2013/0107424 A1 | 5/2013 | Thomas | |
| 2015/0146372 A1* | 5/2015 | French, Jr. | H05K 7/1489 |
| | | | 29/854 |
| 2016/0029510 A1 | 1/2016 | Cader et al. | |
| 2016/0066480 A1 | 3/2016 | Eckberg et al. | |
| 2016/0128238 A1 | 5/2016 | Shedd et al. | |
| 2017/0359923 A1* | 12/2017 | Franz | H05K 7/1457 |

OTHER PUBLICATIONS

PCT International Search Report and Written Opinion in International Application No. PCT/US2019/046792, dated Nov. 13, 2019, 13 pages.

* cited by examiner

INSTALLING A SERVER BOARD

CROSS-REFERENCE TO RELATED APPLICATION

This application is a continuation of, and claims priority under 35 U.S.C. § 120 to, U.S. patent application Ser. No. 16/139,789, filed on Sep. 24, 2018, the entire contents of which are incorporated by reference herein.

TECHNICAL FIELD

This disclosure relates to systems and methods for installing server boards in racks, such as computer server racks in a data center.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

In a general implementation, a server tray assembly includes a server tray support configured to receive a server board that includes a working fluid conduit fluidly coupled to a server board connector disposed on a back plane of the server board, a back wall of the server tray support includes a fluid connector configured to form an unbiased fluid connection with the server board connector. The server tray assembly further includes a locking assembly secured to at least one of a server rack or the server tray support, the locking assembly disposed opposite the fluid connector and configured to engage a portion of the server board to bias the server board toward the fluid connector to fluidly seal the unbiased fluid connection between the server board connector and the fluid connector of the server tray support.

In an aspect combinable with the general implementation, the server tray support includes a portion of a server rack of a data center.

In another aspect combinable with any one of the previous aspects, the fluid connector includes a reciprocating blind mate connector that includes a plurality of quick couplings and the sever board connector includes a corresponding blind mate connector that includes a plurality of quick couplings.

In another aspect combinable with any one of the previous aspects, the locking assembly includes a spring loaded cam lock that includes a cam secured to a pin and configured to pivot about the pin.

In another aspect combinable with any one of the previous aspects, the pin of the spring loaded cam lock is secured to a front end of a base of the server tray support and the cam is configured to engage a bottom edge of the server board.

In another aspect combinable with any one of the previous aspects, the pin of the spring loaded cam lock is secured to one of a pillar of the server tray support or a side wall of the server rack, and the cam is configured to engage a side edge of the server board.

In another aspect combinable with any one of the previous aspects, the locking assembly includes a spring loaded latch secured to one of a pillar of the server tray support or a side wall of the server rack, and the spring loaded latch is configured to snap over a side edge of the server board.

In another aspect combinable with any one of the previous aspects, the spring loaded latch includes two tabs each facing a server tray support slot and configured to snap over a side edge of a respective server board.

In another aspect combinable with any one of the previous aspects, the server board includes one or more heat-generating electronic devices thermally coupled to a cold plate heat exchanger, and the cold plate heat exchanger is thermally coupled to the working fluid conduit.

In another aspect combinable with any one of the previous aspects, the fluid connector is fluidly coupled to a working fluid conduit that extends away from the server tray support and fluidly couples the cold plate heat exchanger to a cooling module.

In another general implementation, a method of installing a server board includes obtaining a server board that includes a working fluid conduit fluidly coupled to a server board connector disposed on a back plane of the server board; inserting the server board into a server tray support that includes a wall including a fluid connector; moving the server board toward the fluid connector of the server tray support such that the server board connector forms an unbiased fluid connection with the fluid connector; and actuating a locking assembly secured to one of a surface of the server tray support or a surface of a server rack to engage a portion of the server board to bias the server board toward the fluid connector to fluidly seal the unbiased fluid connection between the server board connector and the fluid connector of the server tray support.

In an aspect combinable with the general implementation, actuating the locking assembly includes continuing to move the server board toward the fluid connector until a latch of the locking assembly snaps over a side edge of the server board.

In another aspect combinable with any one of the previous aspects, the locking assembly includes a linear actuator and actuating the locking assembly includes extending a cylinder of the linear actuator to push the server board toward the fluid connector.

In another aspect combinable with any one of the previous aspects, the locking assembly includes a spring loaded cam lock that includes a cam secured to a pin and configured to pivot about the pin, and actuating the locking assembly includes turning the cam to engage a surface of the server board.

In another example implementation, a server rack tray support system includes a server tray support mounted on a server rack, the server tray support configured to receive a server board that includes a working fluid conduit fluidly coupled to a server board connector disposed on a back plane of the server board, a back wall of the server tray support that includes a fluid connector configured to form an unbiased fluid connection with the server board connector. The server rack tray support system further includes a locking assembly secured to at least one of the server rack or the server tray support, the locking assembly disposed opposite the fluid connector and configured to engage a portion of the server board to bias the server board toward the fluid connector to fluidly seal the unbiased fluid connection between the server board connector and the fluid connector of the server tray support.

In an aspect combinable with the example implementation, the server tray support includes a shelf.

In another aspect combinable with any one of the previous aspects, the fluid connector includes a reciprocating blind mate connector that includes a plurality of quick couplings and the sever board connector includes a corresponding blind mate connector that includes a plurality of quick couplings.

In another aspect combinable with any one of the previous aspects, the locking assembly includes a spring loaded cam lock that includes a cam secured to a pin and configured to pivot about the pin.

In another aspect combinable with any one of the previous aspects, the locking assembly includes a spring loaded latch secured to one of a pillar of the server tray support or a side wall of the server rack, and the spring loaded latch is configured to snap over a side edge of the server board.

The present disclosure features a server tray assembly that allows a server board to be installed in a server rack with fluid blind mate connections by simply sliding or pushing the server board into a slot of the server rack. As the size of server facilities grows, it can be time-consuming to install server boards with fluid connections that require screwing or otherwise attaching the connections on the back end of the server board. The server tray assembly disclosed herein allows a fluid blind mate connection to be fluidly sealed without the need of using quick connect couplings, additional tubing or hoses, or other types of connectors that may require additional tools or steps to seal the liquid connection on a back end or any side of the server board. Additionally, the server tray assembly described herein features mechanical guides or blind mate connections that can increase the reliability of fluid connections and allows the installation process to be fully automated, reducing human error.

The details of one or more embodiments of the invention are set forth in the accompanying drawings and the description below. Other features, objects, and advantages of the invention will be apparent from the description and drawings, and from the claims.

DETAILED DESCRIPTION

In some example implementations, a server tray assembly according to the present disclosure features a server tray support mounted on a server rack and configured to receive a server tray or board that provides fluid (e.g., liquid) cooling to heat generating devices. The liquid cooling may cool server or network heat generating devices, such as processors, memory modules, switches, and other devices. The server board may include a cold plate cooling system that includes a working fluid conduit in fluid communication with a cold plate heat exchanger and with a server board connector or blind mate connector that connects to a fluid blind mate connector of the server tray support. For example, after the server board is mounted or installed on the server tray support, the fluid conduit may be part of a closed loop between a cold plate heat exchanger of the server board and a cooling module external to the server board. Such closed loop includes a blind mate connection between the server board connector and the fluid blind mate connector of the server tray support. The blind mate connection can initially be an unbiased fluid connection that is fluidly sealed by a locking assembly that biases the server board toward the blind mate connector of the server tray support. There may be tens, hundreds, thousands, tens of thousands or more of such server tray assemblies in a data center.

The server tray assembly may allow for scalability and quick installation of server boards. The locking assembly that biases the server board toward the back fluid connections of the server tray support may allow a user to install server boards by simply sliding or pushing the server board into a slot of the server tray support.

Figure 1A:
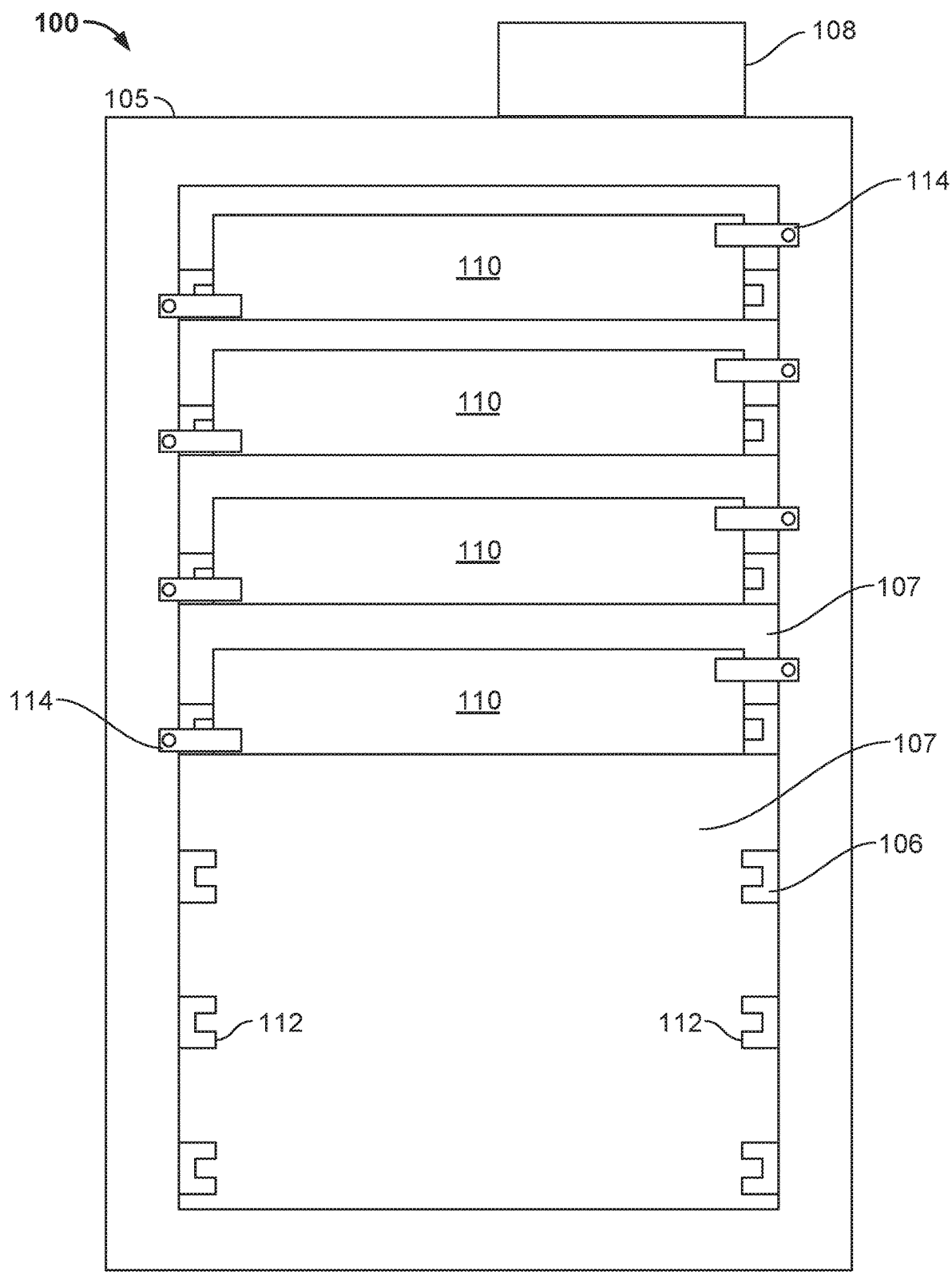
FIG. 1A illustrates a front view of a server rack and server boards configured to mount within a rack used in a data center environment.

FIG. 1A illustrates an example system 100 that includes a server rack 105 (e.g., a 13 inch or 19 inch server rack), a cooling module 108 (e.g., a direct expansion cooling module, a chiller cooling module, an evaporative cooling module, or other cooling module that can supply a cooling fluid), and multiple server trays or server boards 110 mounted within the rack 105. Although a single server rack 105 is illustrated, server rack 105 may be one of a number of server racks within the system 100, which may include a server farm or a co-location facility that contains various rack mounted computer systems. Also, although multiple server boards 110 are illustrated as mounted within the rack 105, there might be only a single server board. Generally, the server rack 105 defines multiple slots 107 that are arranged in an orderly and repeating fashion within the server rack 105, and each slot 107 is a space in the rack into which a corresponding server board 110 can be placed and removed. For example, the server board can be supported on rails 112 that are part of a server tray support 106. Rails 112 project from opposite sides of the rack 105 and can define the position of the slots 107.

Server rack 105, as part of a larger data center, for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server board 110 may be one of a variety of structures that can be mounted in a server rack. For example, in some implementations, the server board 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server board 110 may be a server chassis, or server container (e.g., server box). In some implementations, the server board 110 may be a hard drive cage.

The slots 107 and the server boards 110 can be oriented with the illustrated horizontal arrangement (with respect to gravity). Alternatively, the slots 107 and the server boards 110 can be oriented vertically (with respect to gravity), although this would require some reconfiguration of the cold plate heat exchanger described below. Where the slots are oriented horizontally, they may be stacked vertically in the rack 105, and where the slots are oriented vertically, they may be stacked horizontally in the rack 105.

Figure 4:
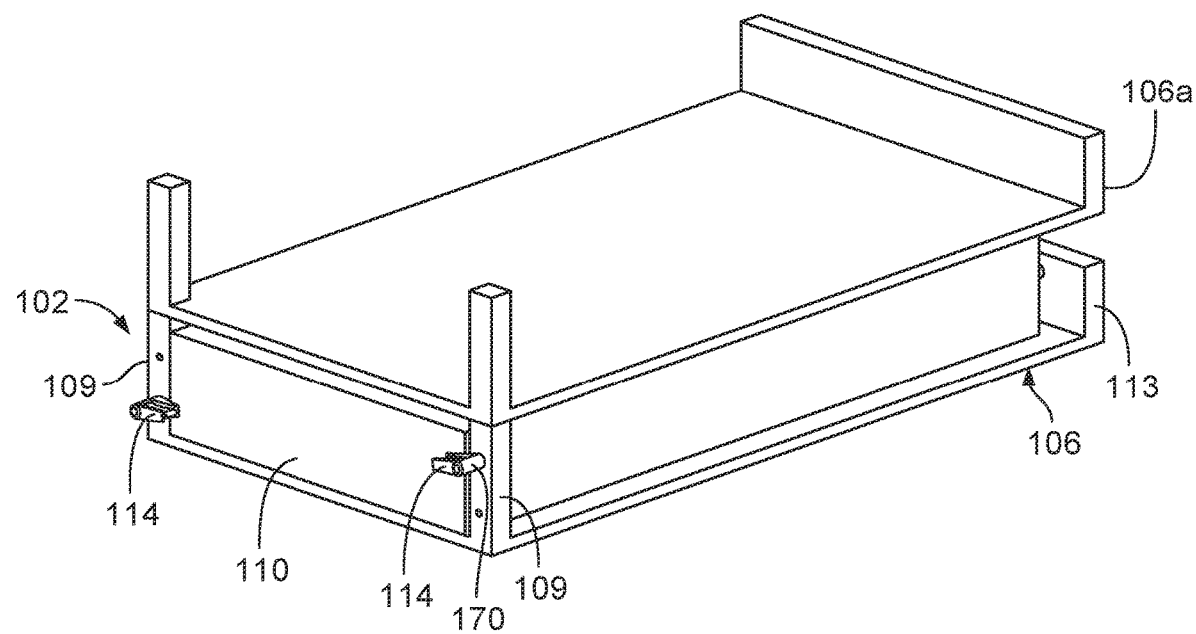
FIG. 4 illustrates a front perspective view of a server board inside a server tray support, with a locking assembly engaged with the server board.

As further discussed in detail with respect to FIG. 4, rack 105 includes locking assemblies 114 that engage server boards 110 to bias the boards toward a blind mate fluid connection (not shown) on a back plane of the server tray support 106 or the server rack 105. Locking assemblies 114 are illustrated as fastened to a side wall of rack 105, but locking assemblies 114 can be secured to a top or bottom surface of rack 105, to rails 112, or to any other surface of the server tray support 106.

Figure 1B:
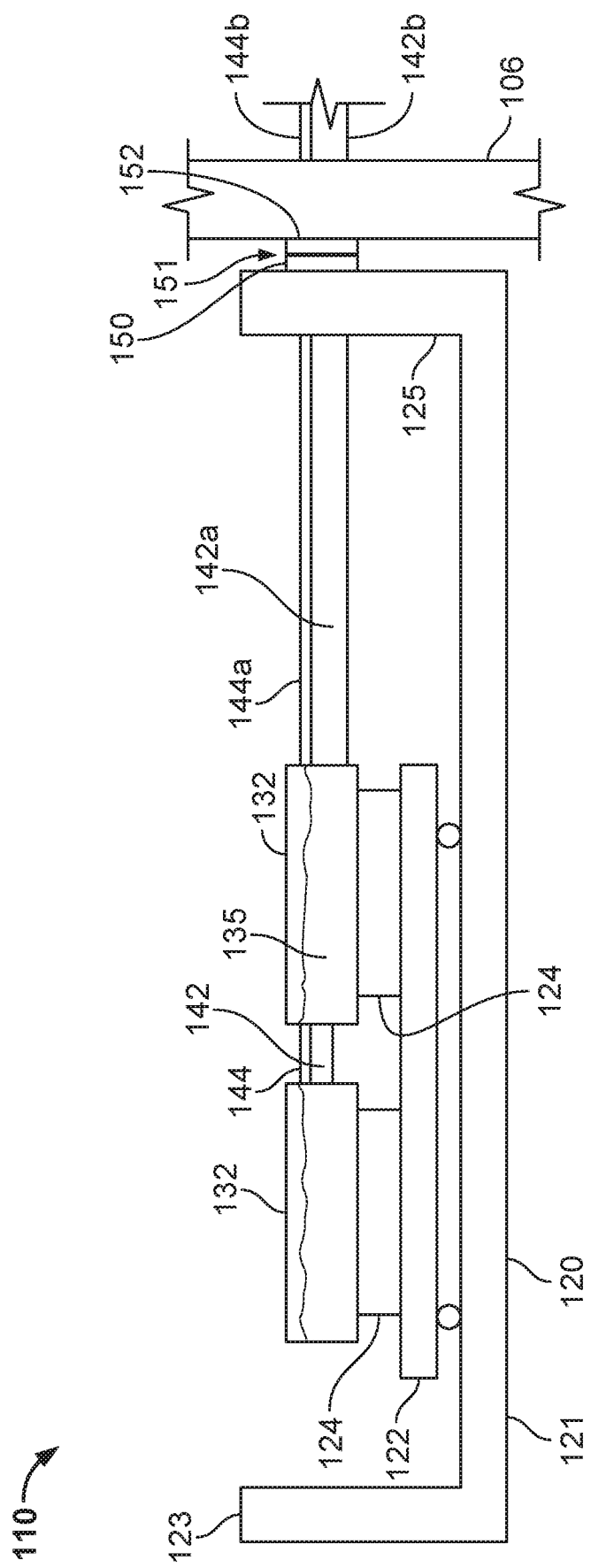
FIG. 1B illustrates a side view of at least a portion of a server board configured to mount within a rack used in a data center environment.

Referring to FIG. 1B, the server board 110 includes a frame or cage 120, a printed circuit board 122, e.g., motherboard, supported on the frame 120, one or more heat-generating electronic devices 124, e.g., a processor or memory, mounted on the printed circuit board 122, and one or more cold plates 132. One or more fans (not shown) can also be mounted on the frame 120.

The frame 120 can include a base 121 (e.g., a flat plate), a front wall 123, and a back wall 125 that project upwardly from the edges of base 121. The base 121 and walls 123 and 125 can be solid bodies or can alternatively include openings for ventilation purposes. Frame 120 may have a top cover and side covers (not shown) to form a closed box. In some examples, frame 120 can include or simply be a flat structure onto which the motherboard 122 can be placed and mounted, so that the frame 120 can be grasped by technicians for moving the motherboard into place and holding it in position within the tray support 106 of rack 105. For example, the server board 110 may be mounted horizontally in the server rack 105 such as by sliding the frame 120 into the slot 107 of tray support 106 and over a pair of rails in the rack 105 on opposed sides of the server board 110—much like sliding a lunch tray into a cafeteria rack.

The illustrated server board 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans (not shown) can be placed on the frame 120 so that air enters at the front edge (through or above wall 123) of the server board 110, closer to the front of the rack 105 when the board 110 is installed in the rack 105, flows over the motherboard 122, over some of the heat generating components on the motherboard 122, and is exhausted from the server rack assembly 110 at the back edge (through or above wall 125), closer to the back of the rack 105 when the board 110 is installed in the rack 105. The one or more fans can be secured to the frame 120 by brackets. Thus, the fans can pull air from within the frame 120 area and push the air after it has been warmed out the rack 105. An underside of the motherboard 122 can be separated from the frame 120 by a gap.

As shown, each cold plate heat exchanger (or "cold plate") 132 contacts the heat-generating electronic device 124 so that heat is drawn by conductive heat transfer from the electronic device 124 to the cold plate 132. For example, the cold plate 132 is in conductive thermal contact with the electronic device 124. In particular, the bottom of the cold plate 132 contacts the top of the electronic device 124. In operation, a working liquid 135, such as water, glycol, or another cooling liquid, is circulated (e.g., pumped) from a cooling liquid source (not shown) through a supply conduit 144 to each cold plate 132. Heat from the electronic device 124 causes the working liquid 135 in the cold plate 132 to rise in temperature. The heated fluid 135 then passes through a return conduit 142, through a blind mate connection 151 to the cooling liquid source. The cooling liquid source may be a mechanical refrigeration cooling source or an evaporative cooling source, for example. Thus, the cooling liquid 135 may remove heat from the electronic device 124.

As shown, the blind mate connection 151 is formed on a back end of board 110, between a blind mate fluid connector 150 of server board 110 and a blind mate fluid connector 152 of server tray support 106. As further discussed in detail with respect to FIG. 2, server tray support 106 may include a pair of rails, a shelf, or another type of supporting structure having a fluid connector 152 at one end. Server board connector 150 is fluidly coupled to both return conduit 142$a$ and supply conduit 144$a$, and fluid connector 152 is connected to a respective return conduit 142$b$ and a supply conduit 144$b$ that extend away from server tray support 106 to a cooling module (shown in FIG. 1A). In other words, return conduit 142$b$ and supply conduit 144$b$ extend away from the server tray support 106 to fluidly couple an evaporator or cold plate heat exchanger of the server board 110 to a cooling module. In an example where case 120 includes a base 121 without a back wall 125, server board connector 150 may be directly secured to or mounted on base 121. In some examples, blind mate connection 151 may include electrical connections. For example, electric cables such as power cables or data cables can be connected to blind mate connector 152, and server board connector 150 can be adapted to receive and supply such power or data to server board 110.

Figure 2:
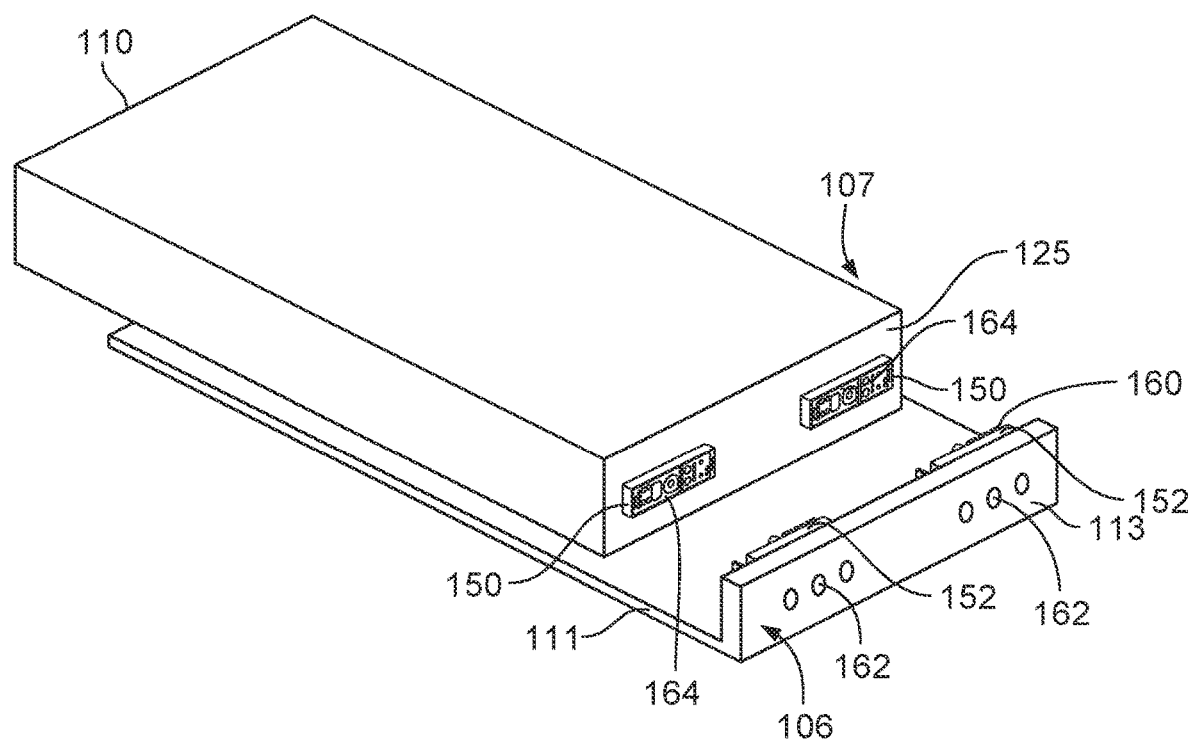
FIG. 2 illustrates a back perspective view of a server board mounted on a server tray support of a rack used in a data center environment.

FIG. 2 illustrates a perspective view of a server board 110 being inserted into a slot 107 of a server tray support 106. For simplicity purposes, server tray support 106 is shown without the server rack or other adjacent server tray supports. Server board 110 includes one or more server board connectors 150 disposed on a back plane (e.g., back wall) 125 of server board 110. Server tray support 106 may include any form of structure adapted to receive and support server board 110, such as a pair of opposed rails (shown in FIG. 1A), a shelf, or a compartment. In the present example, server tray support 106 is a shelf with a base 111 that supports server board 110, and a back wall 113 that includes one or more fluid connectors 152. Shelf 106 can be a part of the server rack that has multiple shelves, with each shelf having respective fluid connectors 152. Each fluid connector 152 has a mating interface 160 and receptacles 162 configured to receive fluid conduits, power cables, data cables, and other cables or conduits required to operate the server board 110. Each mating interface 160 of connectors 152 faces a respective mating interface 164 of server board connectors 150.

To install the server board 110, server board 110 is inserted into slot 107 and pushed toward back wall 113 until server board connectors 150 form a connection with fluid connectors 152. Once a fluidly sealed connection is formed, the cooling fluid may freely flow between fluid connector 152 and server board connector 150 to and from server board 110. In the present example, server board 110 has female blind mate connectors 150 and server tray support has male blind mate connectors 152, but in some cases, the server board may have the male blind mate connector and the server tray support may have the female blind mate connectors.

Figure 3:
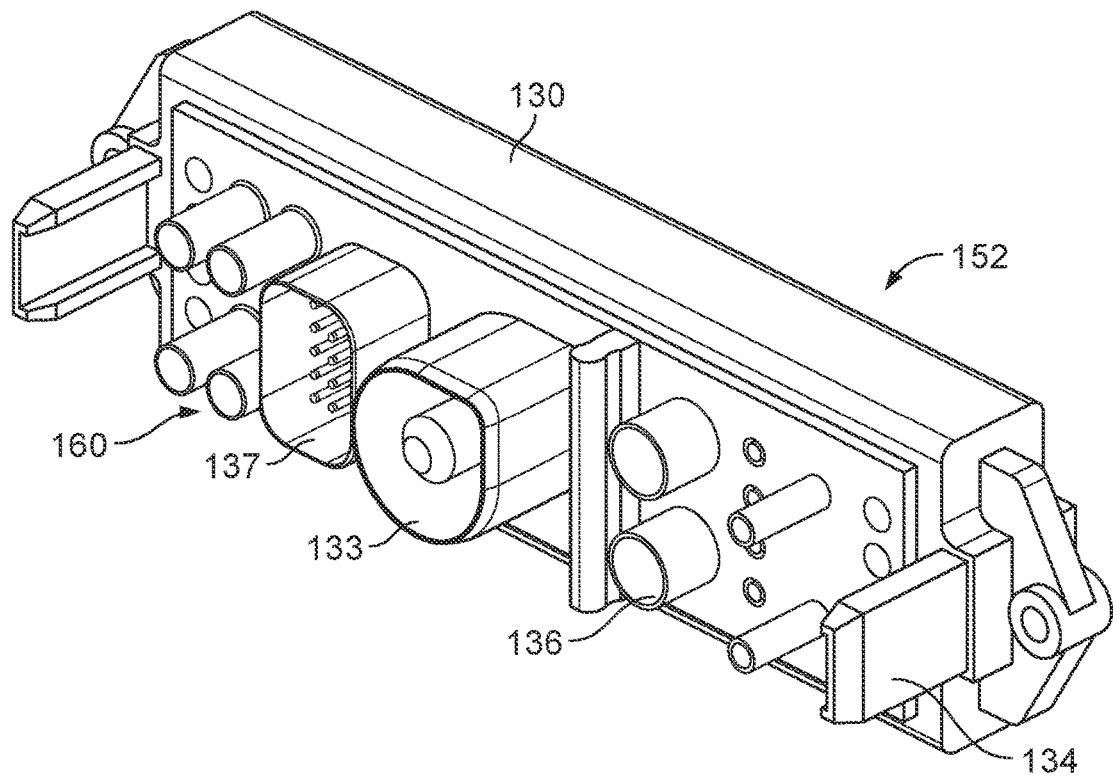
FIG. 3 illustrates a perspective view of a blind mate fluid connector of a server tray support.

FIG. 3 illustrates a perspective view of a male blind mate fluid connector 152. Blind mate connector 152 can be a reciprocating blind mate connector that comprises a plurality of quick couplings. The server board connector (not shown) can be a corresponding blind mate connector that also comprises a plurality of quick couplings. Blind mate fluid connector 152 has a mating interface 160 that includes quick couplings or interfaces, including a data interface 133, an electrical interface 137, and fluid interfaces 136. Blind mate connector 152 has alignment tabs or mechanical guides 134 that can be inserted into the blind mate connector 150 of the server board to align the fluid and electrical connections. Blind mate connector 152 can have a non-spill flush face (not shown) that allows connector 152 to be disconnected without spilling liquid. Blind mate connector 152 can also allow "blind" coupling (e.g., coupling absent a direct visual observation by a human operator during such coupling), compensating for misalignments up to 0.5 mm between axes, for example. Connector 152 can be a blind mate connector without a built-in retention mechanism such as a spring-loaded mechanism that maintains positive pressure in order to fluidly seal the connection. A suitable connector is the CGO Non-Spill Blind Mate Connector from Stäubli.

Figure 5:
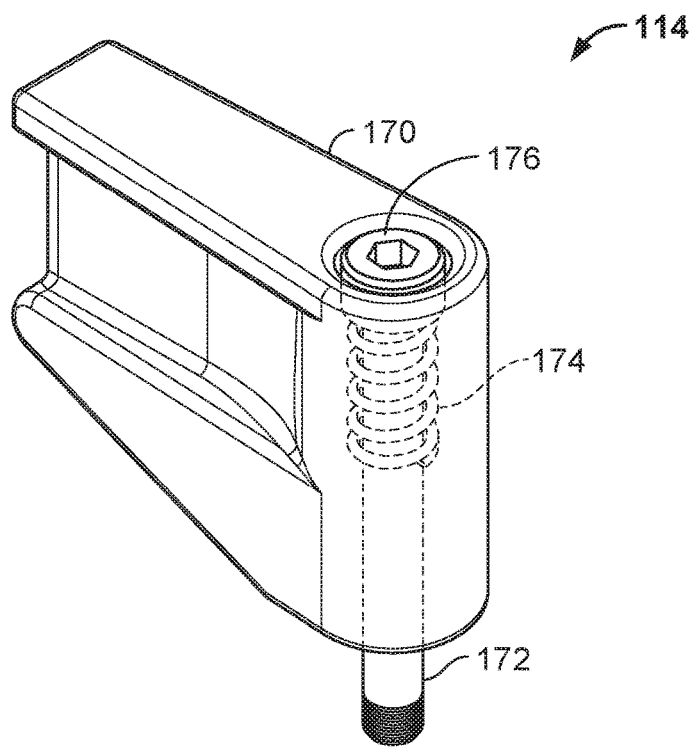
FIG. 5 illustrates a perspective view of a locking assembly according to a first example implementation.

FIG. 4 illustrates a front perspective view of a server tray assembly 102 that includes a server board 110 supported on a server tray support or shelf 106. Shelf 106 is directly below an adjacent shelf 106a of a server rack (not shown). The illustrated server board 110 is properly installed on shelf 106 by forming a fluidly sealed connection (shown in FIG. 1B) on a back end of the server board with the fluid connectors of shelf 106. Server tray assembly 102 has one or more locking assemblies 114 secured to respective pillars 109 of the server tray support or shelf 106 to engage a side of server board 110. Locking assemblies 114 are disposed opposite the fluid connectors of the server board. In this example, locking assembly 114 is a spring-loaded cam lock that biases board 110 toward the fluid connectors on back wall 113 of shelf 106 to seal the unbiased fluid connection. Referring also to FIG. 5, cam lock 114 has a cam 170 disposed about or secured to a pin 172 with an internal spring 174 bearing against a bearing surface of pin head 176 at one end and against an internal bearing surface of cam 170 at another end to bias the cam 170 in a direction away from pin head 176. Cam 170 can pivot about pin 172 to engage or disengage an edge of server board 110. Pin 172 may be a threaded screw adapted to be threaded into a hole of pillar 109. As shown in FIG. 4, a bottom surface of cam 170 bears against a side edge (of the front surface) of server board 110 to bias the board toward back wall 113 as the internal spring imparts positive force on cam 170.

Figure 6:
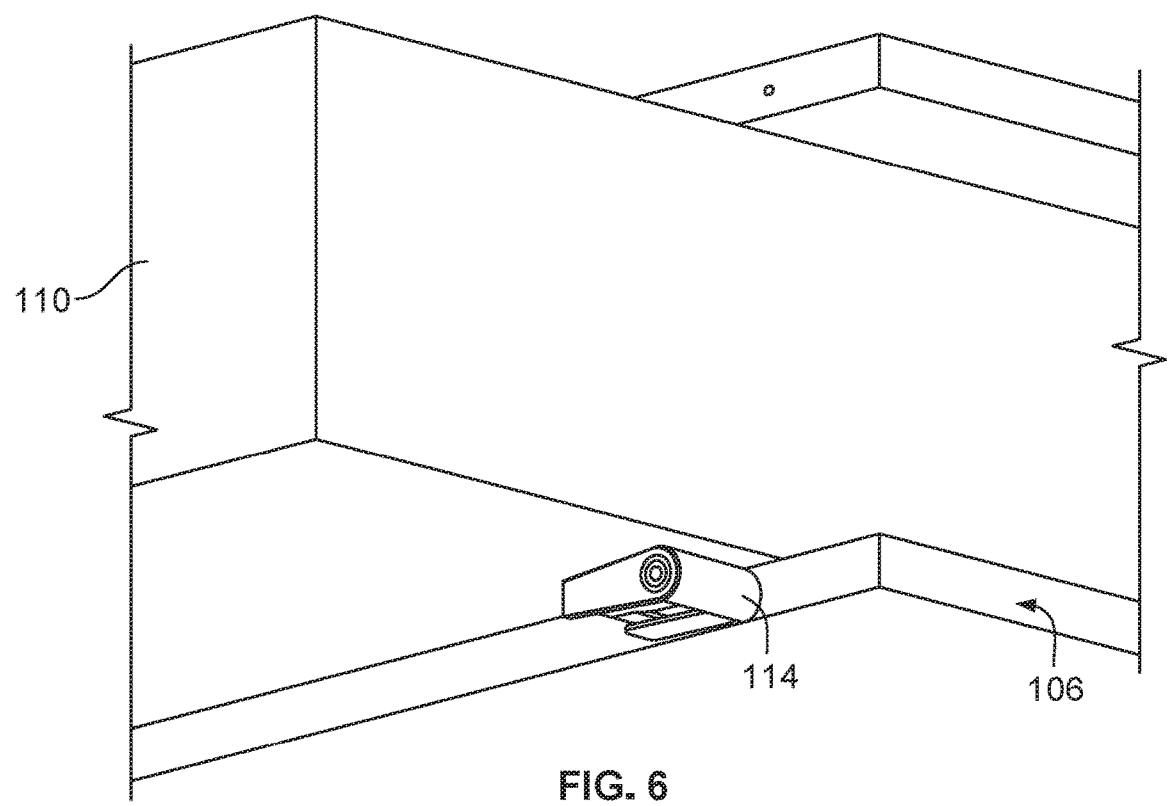
FIG. 6 illustrates a perspective view of a portion of a server tray support with the locking assembly of FIG. 5 disengaged.

FIG. 6 illustrates a perspective view of a portion of a server tray assembly 102 with the cam lock 114 secured to a front end of base 111. As illustrated, cam lock 114 is disengaged from server board 110, allowing server board 110 to be inserted into the shelf or removed from the shelf. Cam lock 114 is configured to engage a bottom edge of the server board 110.

Figure 7:
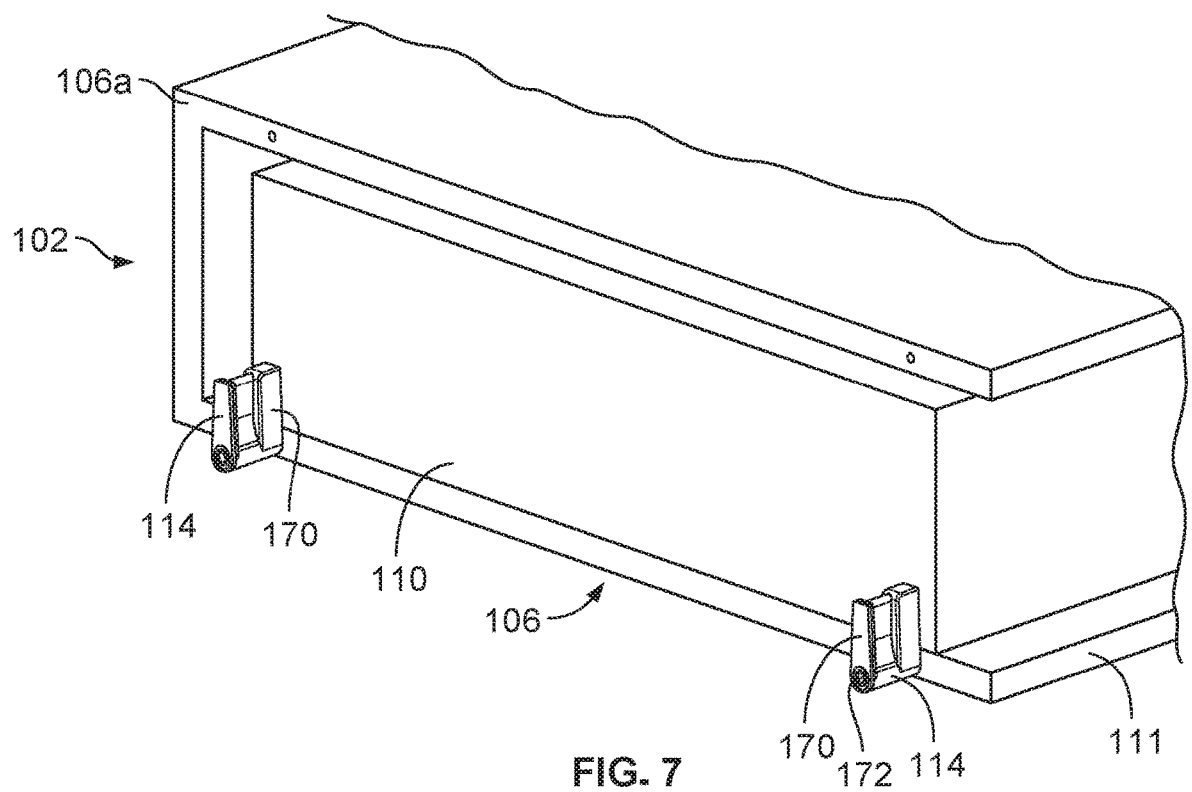
FIG. 7 illustrates a perspective view of a portion of a server tray support with a locking assembly of FIG. 5 engaged.

Referring also to FIG. 7, to form a fluidly sealed connection (shown in FIG. 1B) on the back end of server board 110, server board 110 is first pushed toward the back end of shelf 106 so that server board connector 150 forms an unbiased fluid connection with the fluid connector 152 of the shelf. Then, the cams 170 of each cam lock 114 are turned about pin 172 to engage a bottom edge of server board 110. As cams 170 engage server board 110, cam lock 114 biases (e.g., moves or urges) the server board toward the fluid connectors of shelf 106 to form a fluidly sealed connection.

Figure 8:
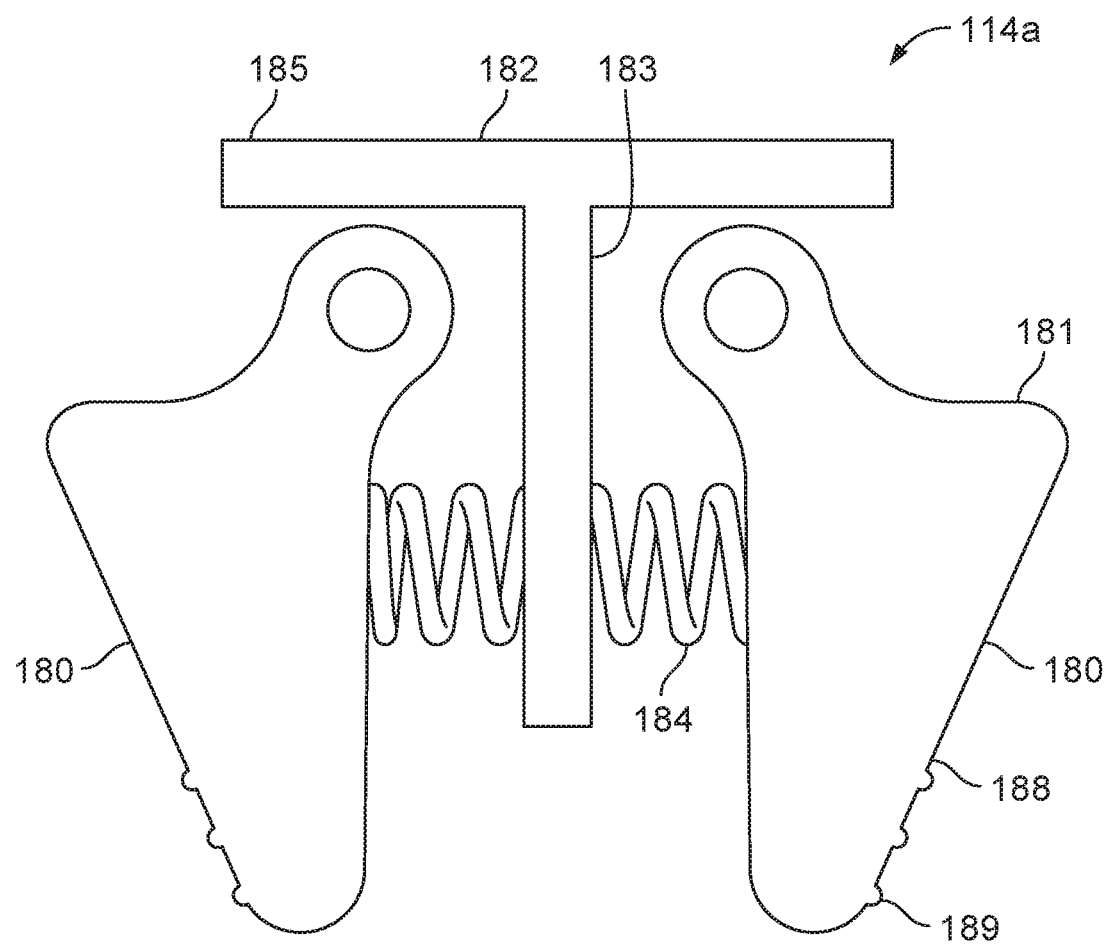
FIG. 8 illustrates a top view of a locking assembly according to a second example implementation.

FIG. 8 illustrates a top view of a locking assembly 114a according to a second exemplary implementation. Locking assembly 114a can be a spring-loaded latch that has two tabs 180 attached to respective springs 184 that project from a T-Shaped structure 182. More specifically, springs 184 are attached to a vertical web 183 of the T-Shaped structure, the web 183 extending from a flange configured to be attached to the shelf of the server rack. In some examples, locking assembly 114a can have only one tab 180, or more than two tabs (not shown).

Figure 9:
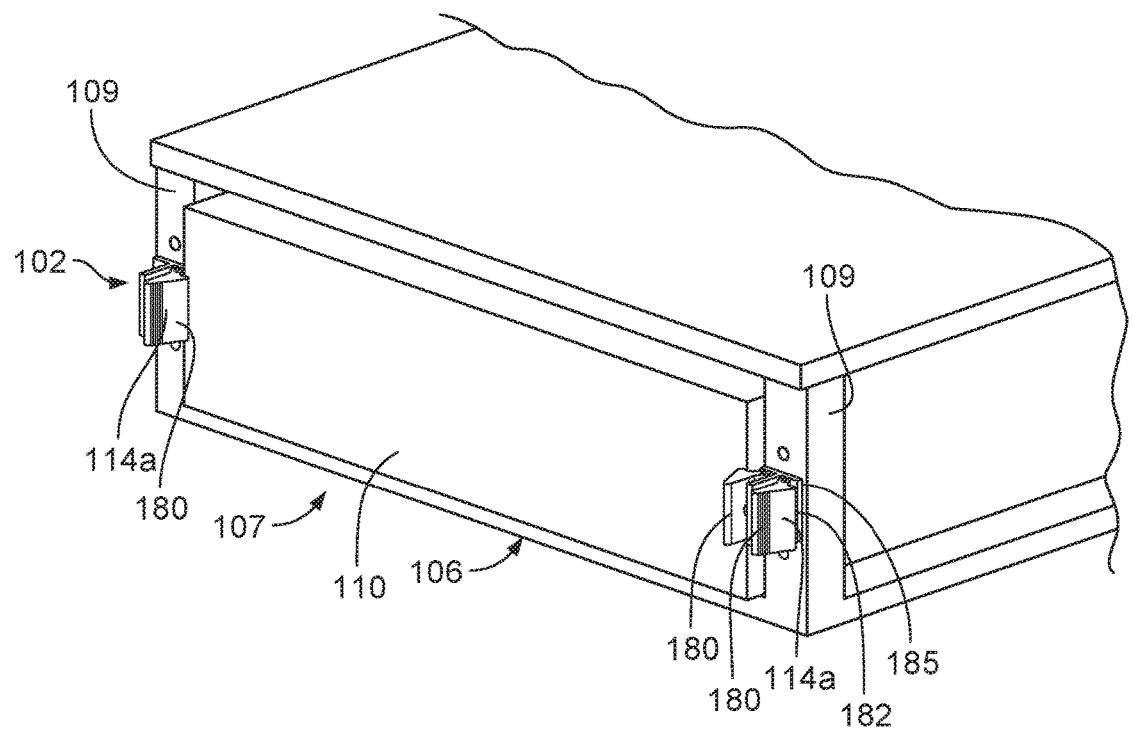
FIG. 9 illustrates a perspective view of a portion of a server tray support with the locking assembly of FIG. 8 engaged.

Referring also to FIG. 9, tabs 180 can act as Snap-In latches that clip over a front surface of the server board 110 to bias the server board toward the back end of the shelf. Each tab 180 has a bearing surface 181 that bears against a front edge of the server board to bias the server board to form a fluidly sealed connection with the fluid connector (not shown) of the shelf 106. The server tray assembly 102 can have two latches 114a each secured to respective pillars 109 of shelf 106 to engage a side edge of server board 110. Each latch 114a has a tab 180 facing a slot 107 of shelf 106, with each latch being configured to snap over a side edge of server board 110.

As shown in FIG. 8, tabs 180 have a sloped surface 188 configured to bear against server board 110 as the server board is slid into slot 107, causing tabs 180 to compress springs 184 to allow server board to be inserted beyond the sloped surface 188 until springs 184 expand again to snap tabs 180 over the front surface of the server board 110. Tabs 180 may include a gripping surface 189 that allows a user to push tabs toward web 183 by hand to disengage tabs 180 from server board 110 to remove the server board. Each of the locking assemblies discussed above can be operated by hand without the need of additional tools. In some cases, the method of installing and retrieving the server boards 110 can be fully automated. For example, to install a server board 110, a robot can be directed to insert the server boards into the slots 107 until the spring-loaded latch 114a snaps over the board to form a fluidly sealed connection.

Figure 10:
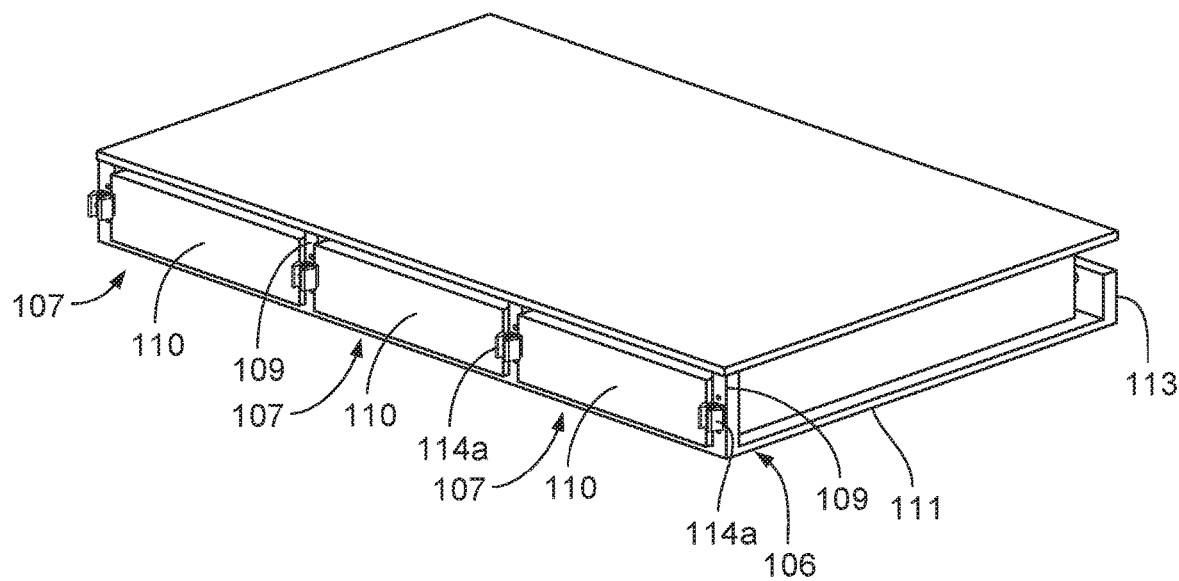
FIG. 10 illustrates a perspective view of a server tray support configured to receive multiple server boards.

FIG. 10 illustrates a perspective view of a shelf 106 configured to receive multiple server boards 110. Shelf 106 has multiple slots 107 formed between pillars 109. Spring-loaded latches 114a are secured to each pillar with respective tabs facing a slot 107 and arranged to receive and secure a server board 110 in place by snapping over a side edge of the board. In some examples, spring-loaded latches 114a may be secured to a base of the shelf, or to the server rack (not shown). In some cases, the locking assembly includes a linear actuator secured to a wall of the server rack or to the server tray support. The linear actuator can extend a cylinder to push a server board 110 toward the fluid connectors of the server tray support.

A number of embodiments have been described. Nevertheless, it will be understood that various modifications may be made without departing from the spirit and scope of what is described. For example, the steps of exemplary operations described herein may be performed in other orders than those described, some steps may be removed, and other steps may be added. Accordingly, other embodiments are within the scope of the following claims.

What is claimed is:

1. A server tray assembly, comprising:
a server tray support configured to receive a server board that comprises a working fluid conduit fluidly coupled to a server board connector disposed on a back plane of the server board, the server tray support comprising a fluid connector configured to form an at least partially unsealed fluid connection with the server board connector; and
a locking assembly comprising a portion fixed to the server tray support or to a server rack fixed to the server tray support such that the server board moves, during insertion of the server board into an opening of the server tray support, along the server tray support with respect to the locking assembly, the locking assembly comprising a spring and resides opposite the fluid connector and configured to move across an opening of the server tray support into which the server broad is inserted and contactingly engage a front portion of the server board to urge the server board, under a preload of the spring, toward the fluid connector to fluidly seal the unbiased and at least partially unsealed fluid connection between the server board connector and the fluid connector of the server tray support;
wherein the locking assembly is configured to automatically move, only under a preload of the spring, across the opening of the server tray support to engage the front portion of the server board and urge the server board toward the fluid connector such that the locking assembly automatically seals the fluid connection when the server board is inserted into the opening of the server tray.

2. The server tray assembly of claim 1, wherein the server tray support comprises a portion of a server rack of a data center.

3. The server tray assembly of claim 1, wherein the fluid connector comprises a reciprocating blind mate connector that comprises a plurality of quick couplings and wherein the sever board connector comprises a corresponding blind mate connector that comprises a plurality of quick couplings.

4. The server tray assembly of claim 1, wherein the locking assembly comprises a spring loaded cam lock comprising a cam pivotable about a pin to engage the portion of the server board, the spring is compressible or extendable to move the cam along the pin to urge, with the cam engaging the portion of the server board, the server board toward the fluid connector.

5. The server tray assembly of claim 4, wherein the pin of the spring loaded cam lock is secured to a front end of a base of the server tray support and wherein the cam is configured to contactingly engage a bottom edge of the server board.

6. The server tray assembly of claim 4, wherein the pin of the spring loaded cam lock is secured to one of a pillar of the server tray support or a side wall of the server rack, and wherein the cam is configured to contactingly engage a side edge of the server board.

7. The server tray assembly of claim 1, wherein the locking assembly comprises a spring loaded latch secured to one of a pillar of the server tray support or a side wall of the server rack, and the spring loaded latch is configured to snap over a side edge of the server board, and the spring comprises a compression spring in the spring loaded latch.

8. The server tray assembly of claim 7, wherein the spring loaded latch comprises a web attached to and extending from the server tray support or the server rack, the spring attached to and extending from the web, the spring loaded latch comprises two tabs with at least one of the tabs attached to the spring and each tab facing a server tray support slot and configured to automatically snap, only under a pre load of the spring, over a side edge of a respective server board.

9. The server tray assembly of claim 1, wherein the server board comprises one or more heat-generating electronic devices thermally coupled to a cold plate heat exchanger, and wherein the cold plate heat exchanger is thermally coupled to the working fluid conduit.

10. The server tray assembly of claim 9, wherein the fluid connector is fluidly coupled to a working fluid conduit that extends away from the server tray support and fluidly couples the cold plate heat exchanger to a cooling module.

11. The server tray assembly of claim 1, wherein the locking assembly comprises two tabs each facing a server tray support slot and configured to snap over a side edge of a respective server board.

12. The server tray assembly of claim 1, wherein the locking assembly is attached to a front surface of the server tray support or the server rack, the front surface extending, with the server board inserted into the opening of the server tray support, along a plane parallel with respect to the back plain of the server board.

13. The server tray assembly of claim 2, wherein the fluid connector comprises a reciprocating blind mate connector that comprises a plurality of quick couplings and wherein the sever board connector comprises a corresponding blind mate connector that comprises a plurality of quick couplings.

14. A method of installing a server board, the method comprising:

obtaining a server board that comprises a working fluid conduit fluidly coupled to a server board connector disposed on a back plane of the server board;

inserting the server board through an opening of a server tray support and into the server tray support that comprises a wall comprising a fluid connector;

moving the server board toward the fluid connector of the server tray support such that the server board connector forms an unbiased and at least partially unsealed fluid connection with the fluid connector;

actuating a locking assembly that comprises a portion mechanically attached to one of a front surface of the server tray support or a front surface of a server rack fixed to the server tray support such that the server board moves, during movement of the server board toward the fluid connector, with respect to the locking assembly, the actuating comprising urging the server board toward the fluid connector and away from a front surface of the locking assembly to fluidly seal the unbiased and at least partially unsealed fluid connection between the server board connector and the fluid connector of the server tray support, wherein actuating the locking assembly comprises allowing the locking assembly to move, only under a preload of the spring, across the opening of the server tray support to engage the front portion of the server board and urge the server board toward the fluid connector such that the locking assembly automatically seals the fluid connection when the server board is inserted into the opening of the server tray; and maintaining, with the spring of the locking assembly, the fluid seal of the fluid connection between the server board connector and the fluid connector of the server tray support.

15. The method of claim 14, further comprising flowing a working fluid through the fluid connector, through the server board connector, and into the working fluid conduit.

16. The method of claim 14, wherein the locking assembly comprises a spring loaded cam lock comprising a cam secured to a pin extending along an axis perpendicular to the back plane of the server board and the cam is configured to pivot about the pin and engage the portion of the server board, and the at least one spring is compressible or extendable in a direction parallel to the pin axis to move the cam along the pin axis to urge, with the cam engaging the portion of the server board, the server board toward the fluid connector.

17. The method of claim 16, wherein a bottom surface of the cam in configured to bear against a front surface of the server board under a preload of the spring to move the server board toward the wall away from a head of the spring as the spring imparts positive force on the cam, and moving the server board toward the fluid connector comprises moving the server board past the bottom surface of the cam to allow the cam to engage the server board.

18. The method of claim 16, wherein actuating the locking assembly comprises turning the cam about the pin to engage a front surface of the server board.

19. The method of claim 15, wherein the working fluid comprises water.

20. The method of claim 15, further comprising transferring heat from the server board to the working fluid to heat the working fluid.

21. The method of claim 20, further comprising flowing the heated working fluid to another fluid connector on the wall.

22. The method of claim 15, wherein the working fluid comprises water.

* * * * *